(12) United States Patent
Bolich et al.

(10) Patent No.: US 6,171,120 B1
(45) Date of Patent: Jan. 9, 2001

(54) MODULAR CARD CAGE WITH CONNECTION MECHANISM

(75) Inventors: Bryan D. Bolich, San Jose; Christopher S. Wheaton, San Francisco; Mark J. Glusker, San Mateo, all of CA (US)

(73) Assignee: Silicon Graphics, Inc., Mountain View, CA (US)

( * ) Notice: Under 35 U.S.C. 154(b), the term of this patent shall be extended for 0 days.

(21) Appl. No.: 09/005,219

(22) Filed: Jan. 9, 1998

(51) Int. Cl.[7] .............................. H01R 13/62; H05K 5/00
(52) U.S. Cl. ........................ 439/157; 361/683; 361/756
(58) Field of Search .................................. 439/157, 372, 439/61; 361/683–686, 727

(56) References Cited

U.S. PATENT DOCUMENTS

| | | | |
|---|---|---|---|
| 4,821,146 | * 4/1989 | Behrens et al. | 361/692 |
| 5,077,722 | * 12/1991 | Geist et al. | 369/75.1 |
| 5,600,542 | * 2/1997 | Malgouries | 361/157 |
| 5,708,563 | * 1/1998 | Cranston, III et al. | 361/683 |
| 5,831,821 | * 11/1998 | Scholder et al. | 361/686 |
| 5,848,906 | * 12/1998 | Glusker et al. | 439/157 |

* cited by examiner

Primary Examiner—Neil Abrams
Assistant Examiner—Michael C. Zarroli
(74) Attorney, Agent, or Firm—Wagner, Murabito & Hao LLP

(57) ABSTRACT

A card cage for connecting circuit board cards to a computer is disclosed. The card cage includes connector receptacles for receiving circuit board cards such as PCI cards. The card cage also includes a connection mechanism for electrically coupling the connector receptacles to the computer. In one embodiment, the connection mechanism includes a compression connector and a locking mechanism for electrically and mechanically coupling the card cage to the computer. Thus circuit board cards may be easily coupled to a computer by inserting the circuit board cards into the card cage and attaching the card cage to the computer.

9 Claims, 9 Drawing Sheets

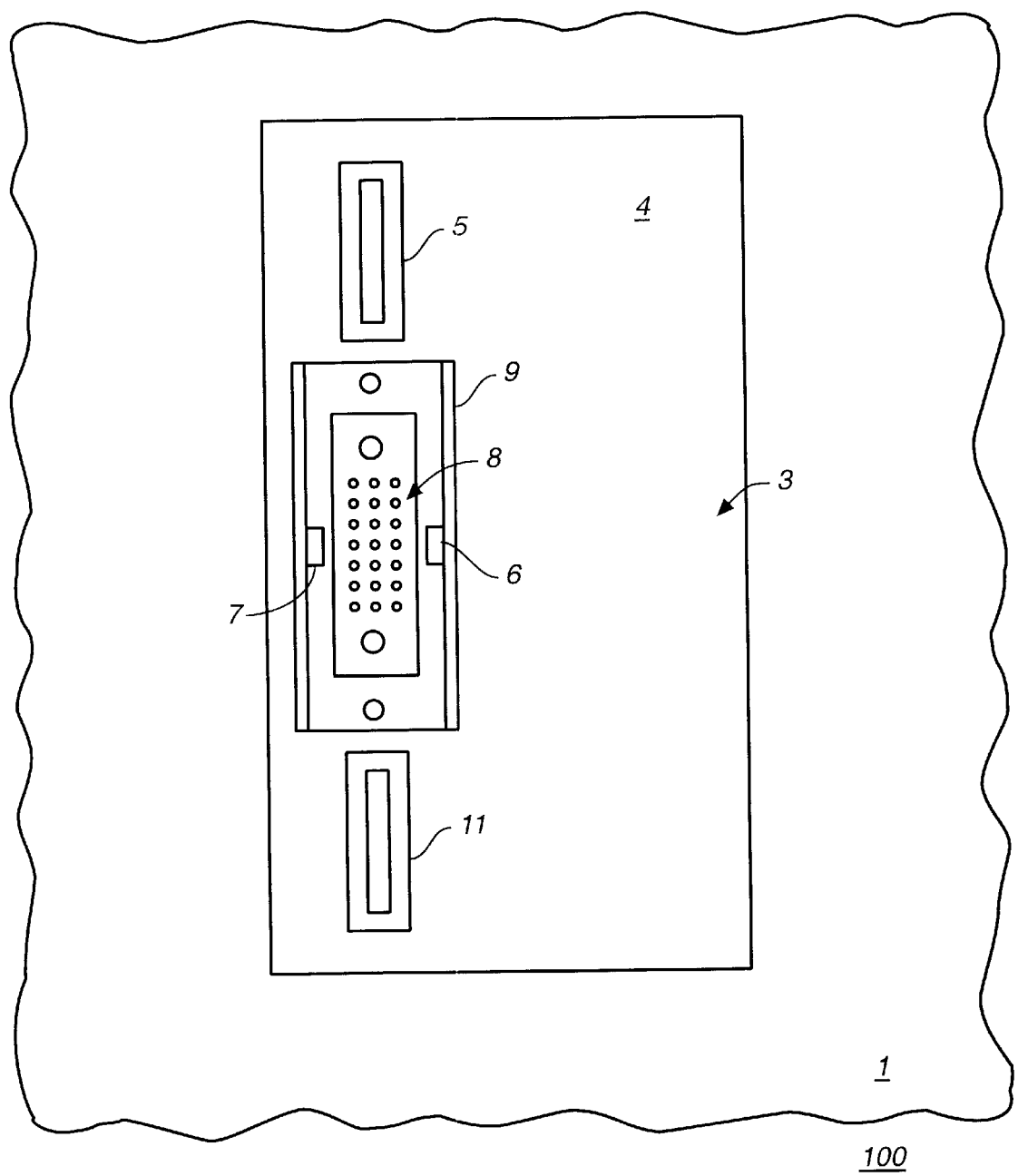
FIG._1A

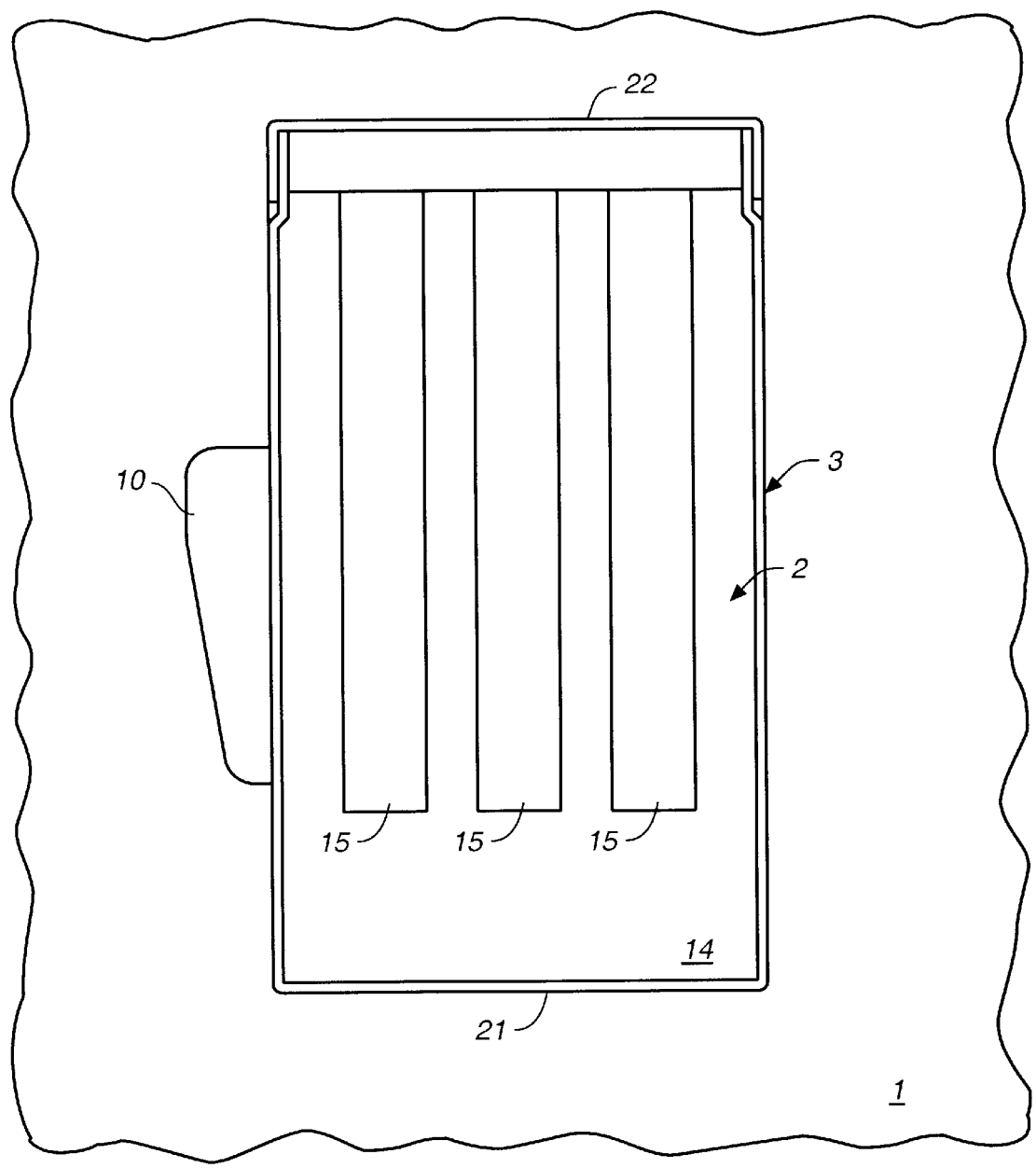
FIG._1B

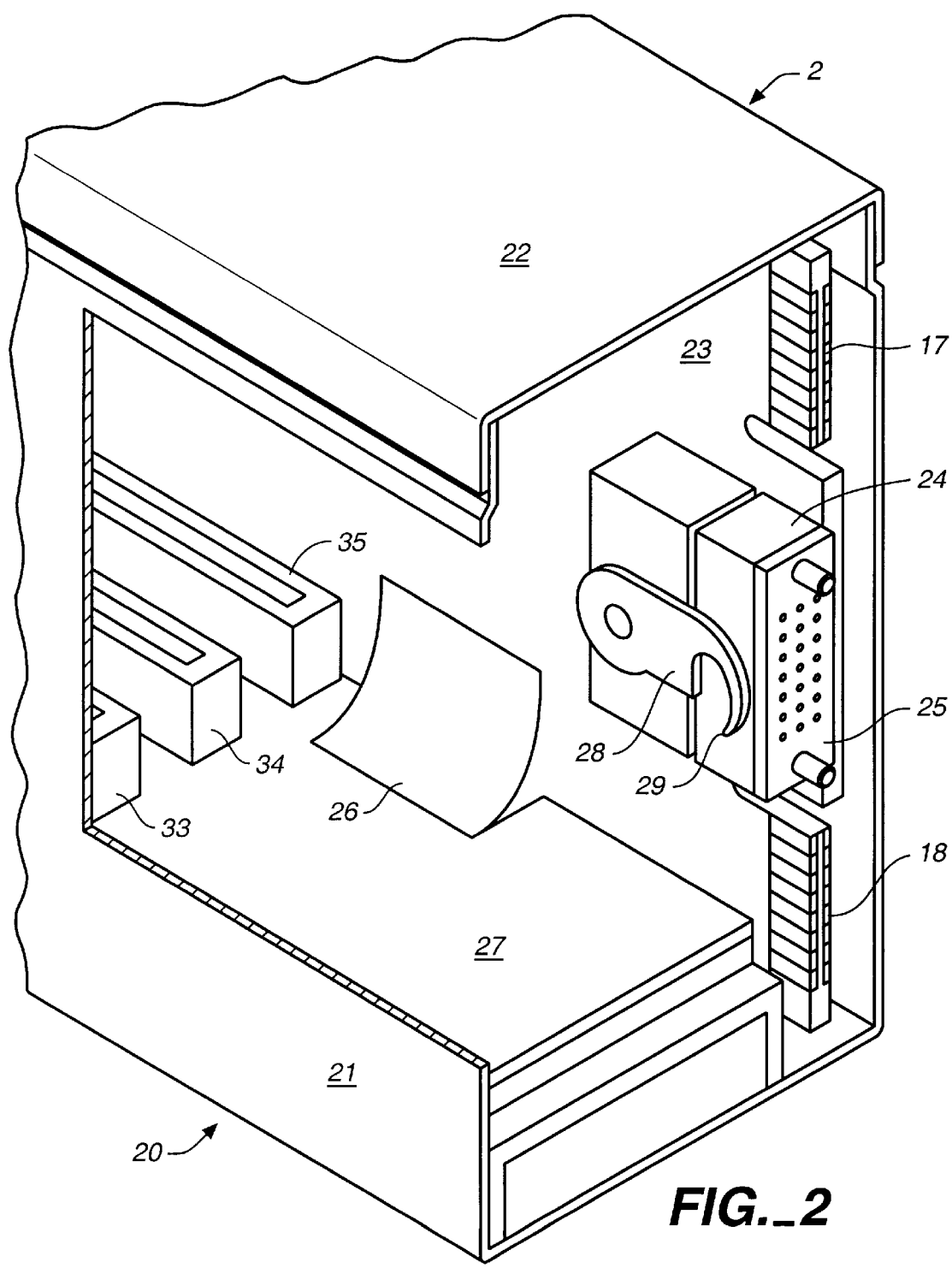
FIG._2

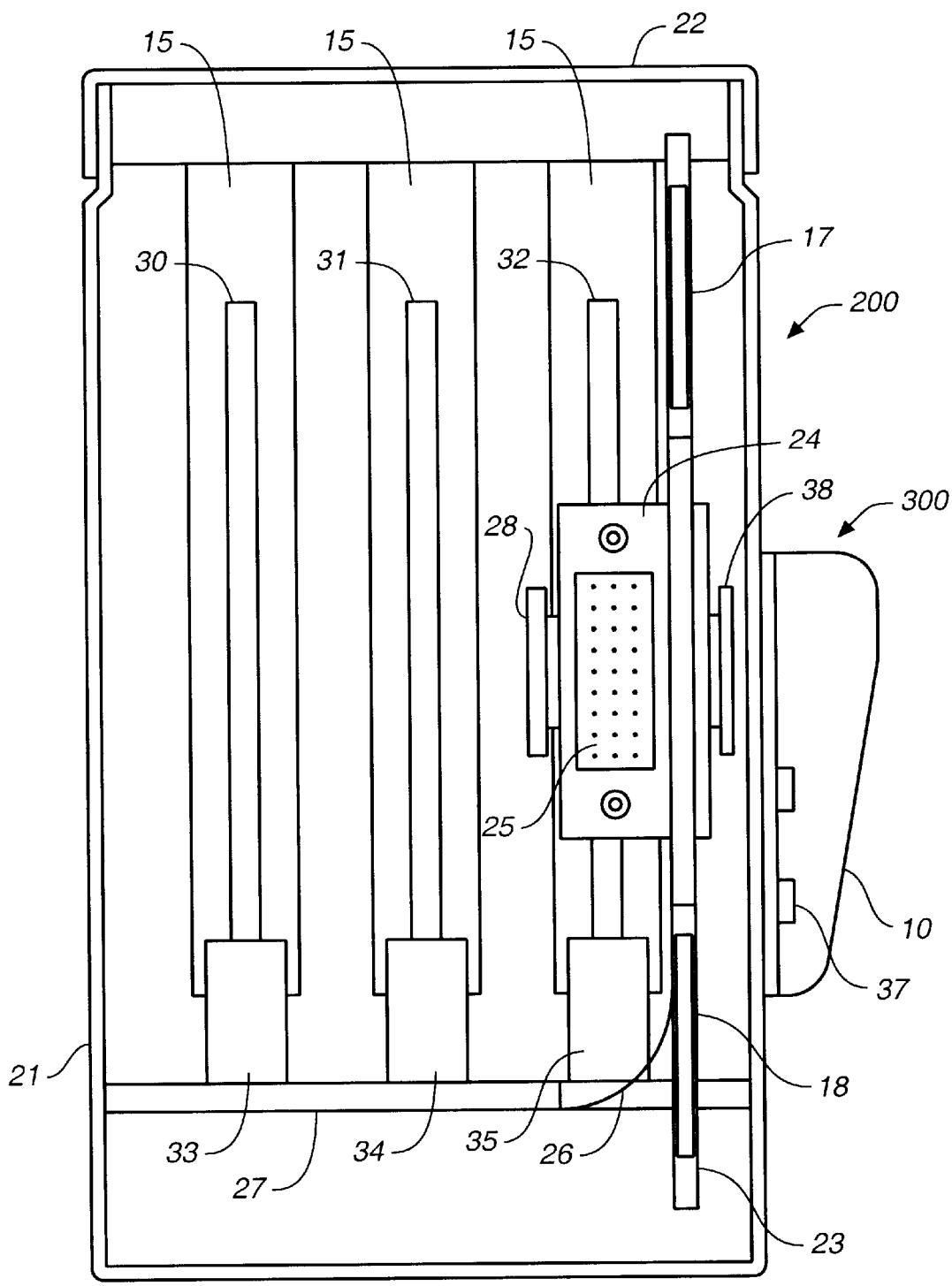
FIG._3

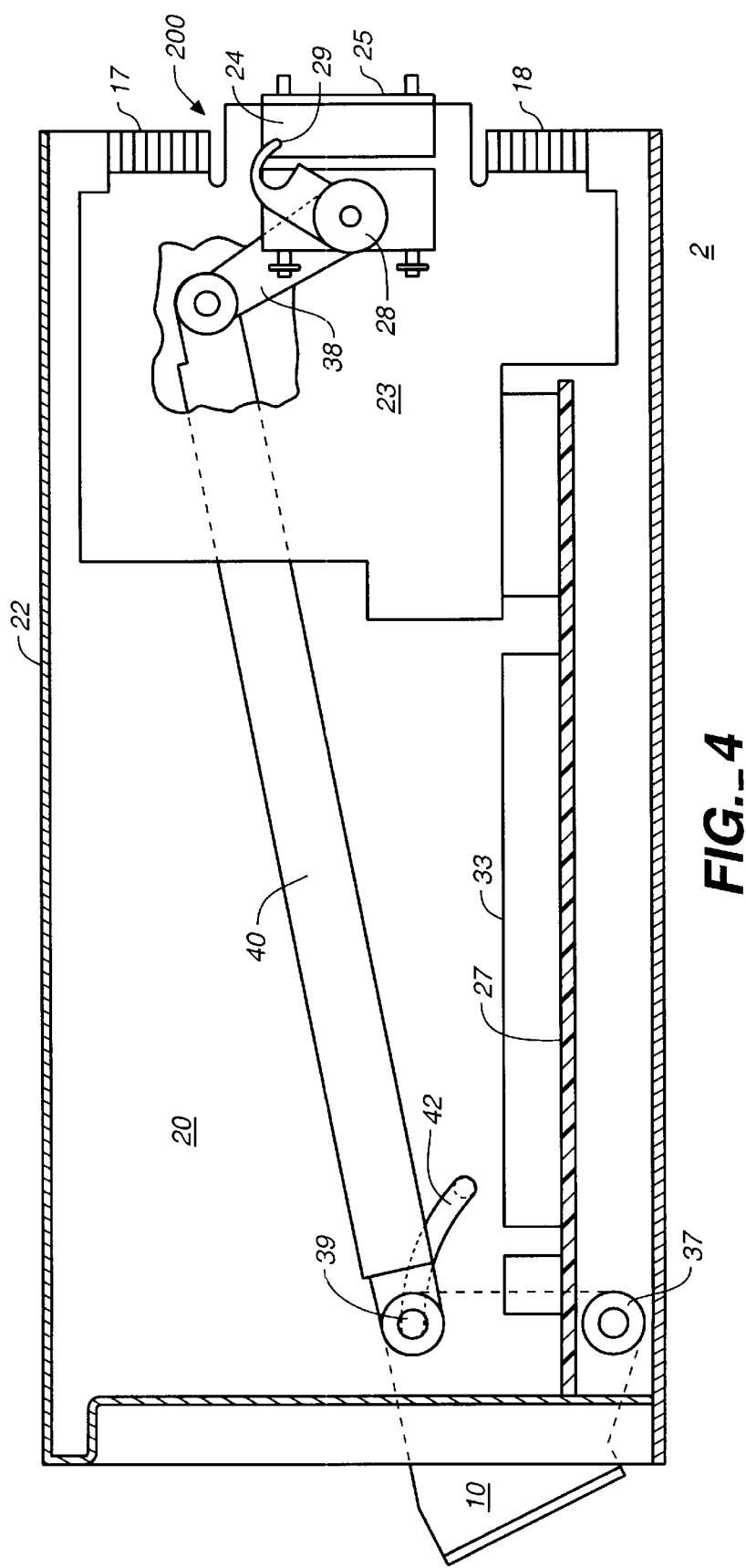
FIG._4

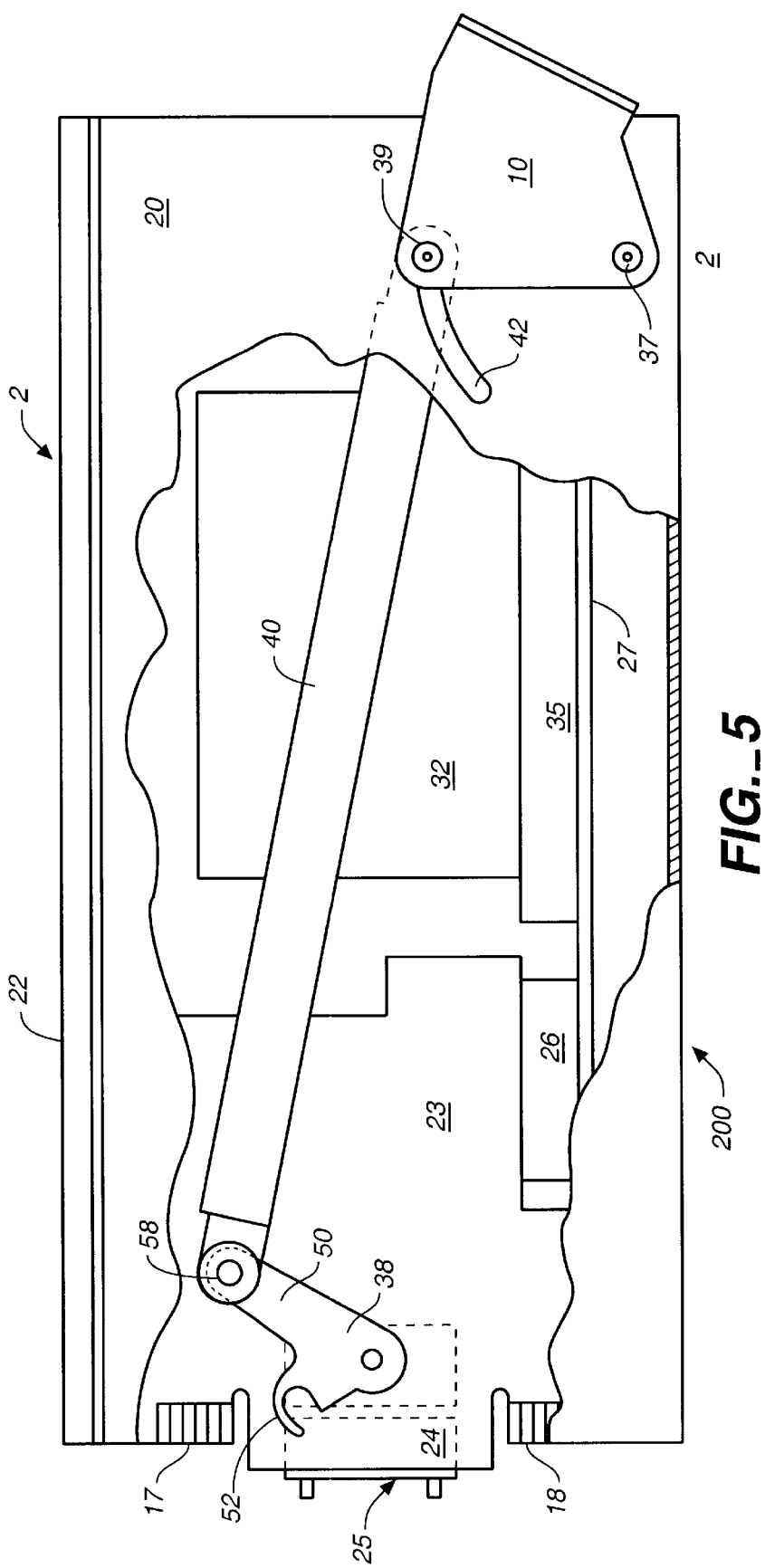
FIG._5

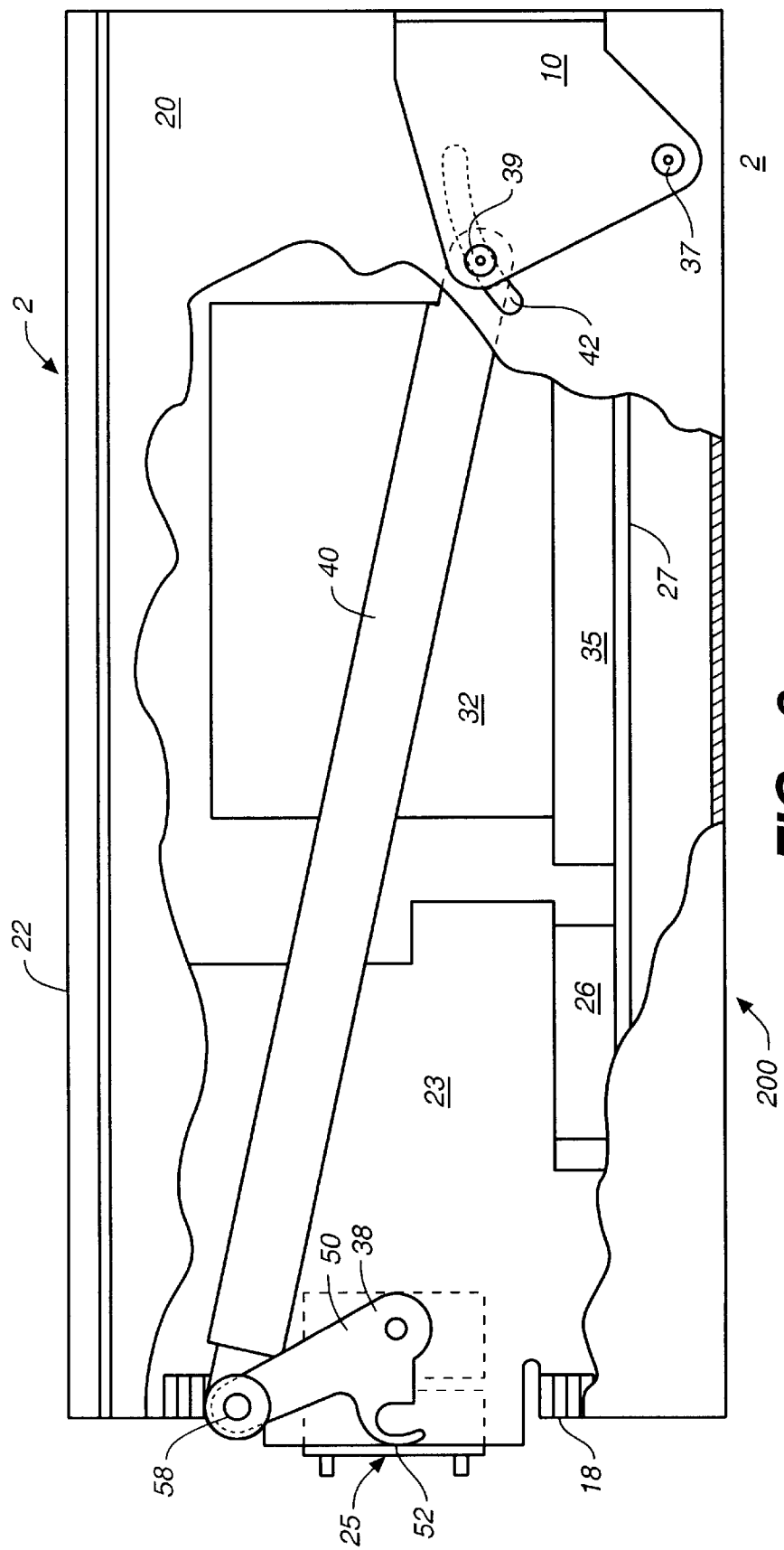
FIG._6

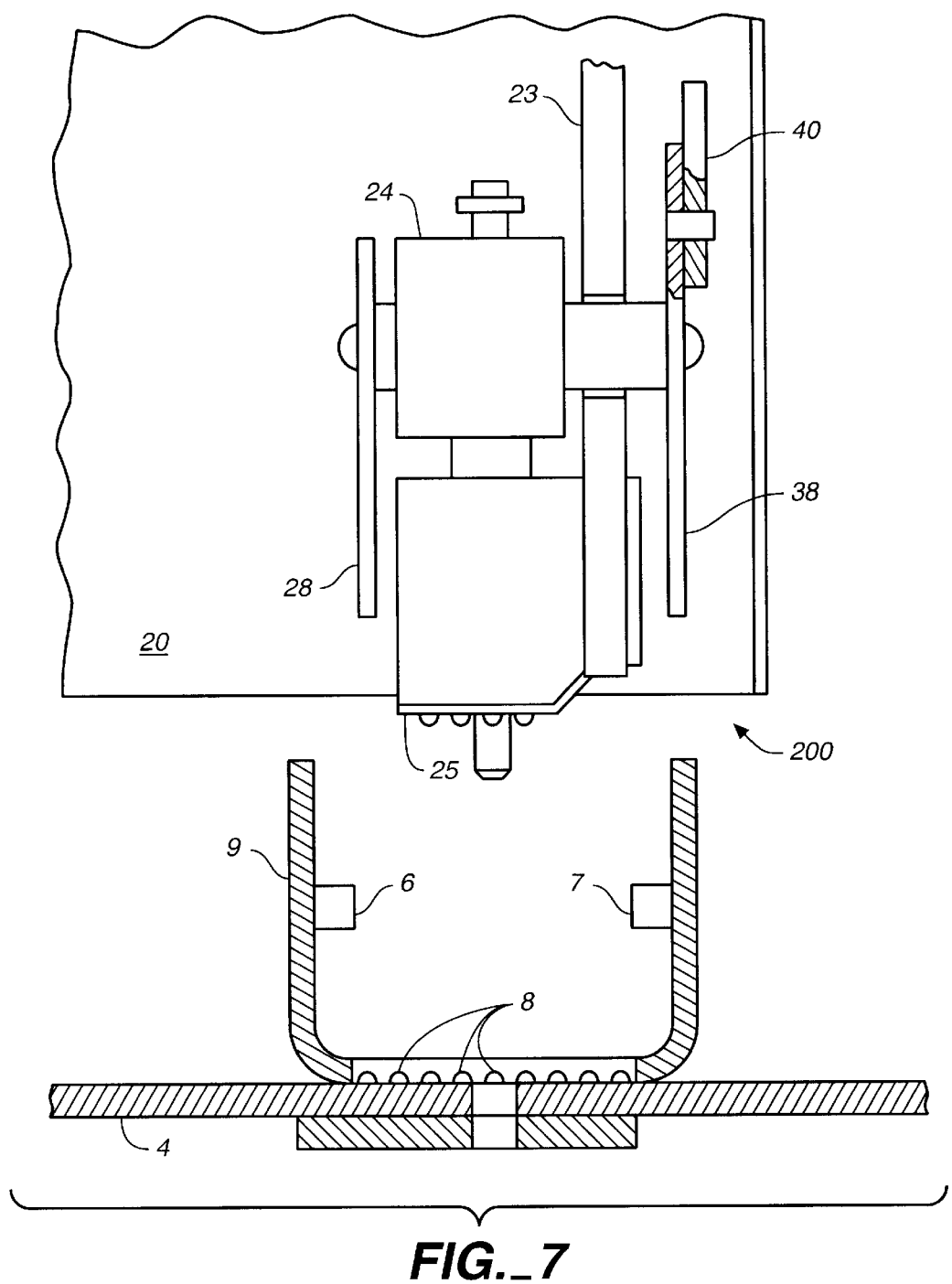
FIG._7

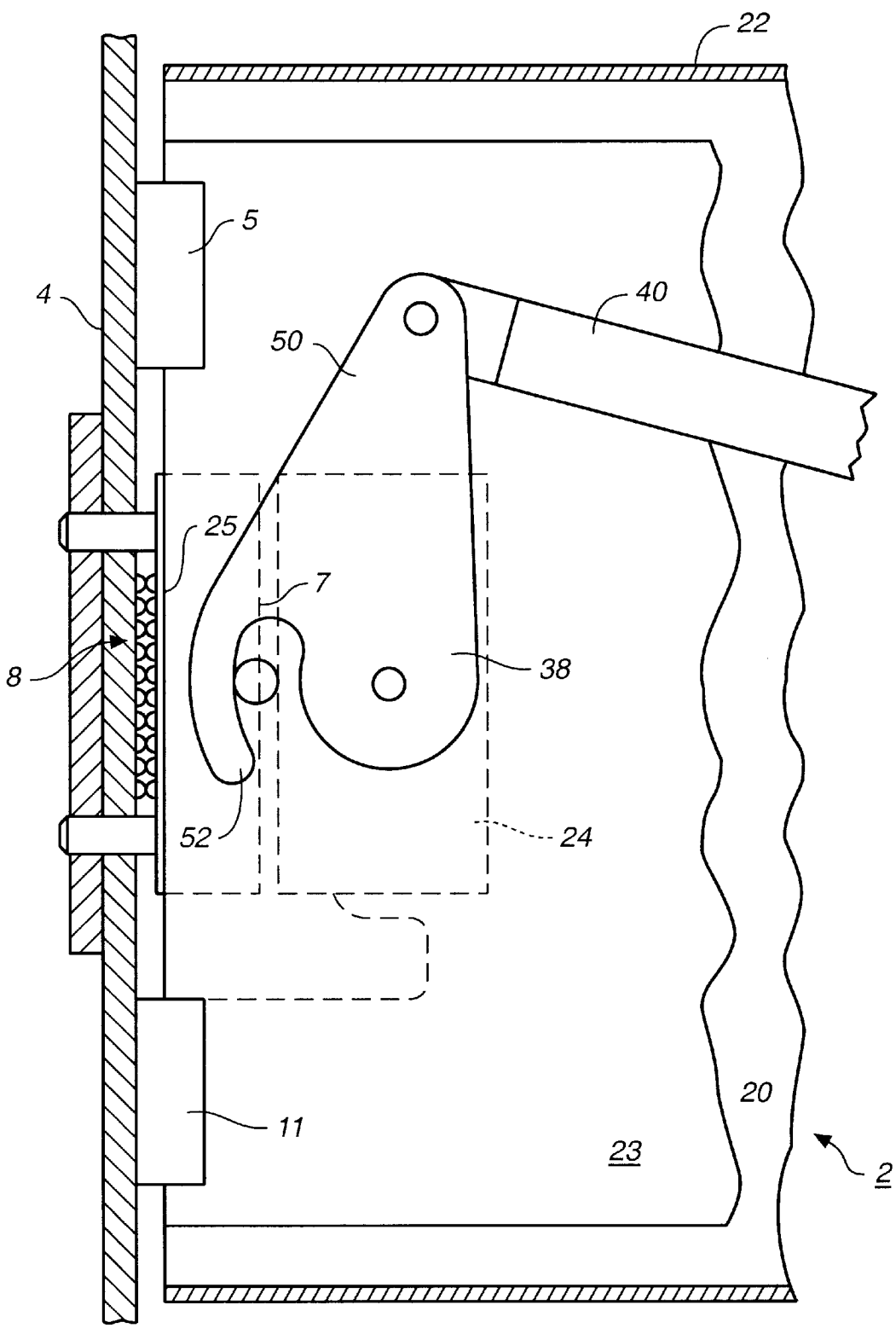
FIG._8

MODULAR CARD CAGE WITH CONNECTION MECHANISM

TECHNICAL FIELD

The present claimed invention relates to the field of connection systems for electronic components. More specifically, the present claimed invention relates to an improved apparatus for connecting circuit board cards to a computer system.

BACKGROUND ART

Prior art computer systems use circuit board cards for adding additional functionality to the computer system. Circuit boards are installed into each computer to add the desired functionality to the computer system. However, with prior art computer systems, the circuit board cards must be installed within the housing of the computer. Typically, housings for high end computer systems include outer skins made of plastic which cover an chassis which serves as an electromagnetic interference (EMI) enclosure.

Typically, in order to install or remove a circuit board card in a prior art computer system that includes an outer skin and an chassis, the installer must first remove the skin covering the chassis. This usually involves removing one or more screws that hold the skin to the chassis. Then, a door or panel must be removed so as to allow access to the internal components of the computer that are contained within the chassis. Typically, screws which hold the door or panel in place must be removed. The installer then must slide the circuit board card into a slot adapted to receive the circuit board card for installation of a circuit board card or slide a circuit board card out from a particular slot for removal of a circuit board card.

Thus, the installation and removal process is difficult and time consuming. The installation and removal of circuit board cards is complicated by the restricted access that the installer has to the interior of the computer due to internal computer components and systems. In particular, other circuit boards and daughter boards and wiring make access difficult.

In some prior art systems, multiple circuit board cards are connected to a daughter card which is then connected to the motherboard. In these systems, the daughter board must first be detached from the motherboard prior to installation or removal of the circuit board card which is to be attached to the daughter board. The circuit board cards are then attached to the daughter card using conventional card edge connectors located on the circuit board cards to be added which mate with connector receptacles adapted to receive the card edge connectors. When a compression connector is used to connect the mother board to the daughter board, the mounting screws which secure the compression connector to the motherboard must be removed and replaced. However, in a crowded computer housing, it is often difficult to align the compression connector and it is difficult to attach the compression connector to the motherboard so as to compress the compression connector. Thus, it is difficult to lock the two circuit boards together. The process is particularly cumbersome for computer users who are accustomed to prior art designs which simply involve pressing the two boards together so as to mate card edge connectors to slotted connector receptacles.

After the installation process is complete, the door or panel must then be replaced. Then the skin must be replaced. This process must be repeated each time that a circuit board card is to be added or removed.

What is needed is a computer system which provides an easy way to install and remove circuit board cards. In addition, the connection mechanism should provide for connectivity using methods which allow for reduced signal delay.

DISCLOSURE OF THE INVENTION

The present invention meets the above need with a card cage which allows for the easy installation and removal of circuit board cards.

A card cage which couples to a computer system is disclosed. In one embodiment the computer system includes a chassis which encloses a mother board. The chassis includes an opening adapted to receive a card cage. A connection mechanism electrically connects the mother board to the card cage.

The card cage of the present invention includes a daughter card with connector receptacle. The card cage and the daughter card are connected to the motherboard via the connection mechanism. The connector receptacles on the daughter card are adapted to receive circuit board cards. Thus, one or more circuit board cards may be coupled to the computer system simply by inserting the circuit board card(s) into the connector receptacle(s) of the card cage and inserting and attaching the card cage in the computer chassis.

In one embodiment, the connection mechanism includes a flex circuit and a compression connector. The flex circuit is electrically coupled to the connector receptacles and includes a grid array which extends across the front of the compression connector. A corresponding grid array is disposed in the motherboard such that, upon the engagement of the compression connector, electrical contact is made between the grid array of the motherboard and the grid array of the flex circuit to electrically connect the connector receptacles of the card cage the the mother board.

In one embodiment the compression connector is coupled to the motherboard by two cams which are disposed on opposite sides of the compression connector such that the cams rotate in unison. A backplate hook is attached to the motherboard which includes two posts. The card cage is mechanically locked in place within the chassis by the engagement of the compression connector such that the compression connector is mechanically secured to the mother board. Upon the engagement of the compression connector into the engaged position, the cams are rotated such that each cam engages a post of the backplate hook so as to draw the compression connector and the card cage towards the motherboard. In the engaged position, the cams are fully engaged so as to secure the card cage and so as to press the front surface of the compression connector tightly against the mother board so as to press the grid array of the flex circuit to the corresponding grid array on the motherboard. This makes a good electrical contact between the flex circuit and the circuits of the mother board so as to electrically connect the circuits of the connectors to the circuits of the motherboard.

The card cage includes a locking lever which is attached to an arm which couples to one of the cams for rotation of the cams into the engaged position and into the disengaged position. The locking lever is placed on one side of the card cage such that it is accessible from the rear of the card cage. Since the lever is accessible from the rear of the card cage, the lever is easily accessible to a user when the card cage is inserted into the chassis.

In operation, the card cage is opened by removing the top and the desired circuit board cards are placed into the connector receptacles in the card cage and the top of the card cage is replaced. The card cage is then inserted into the chassis. The locking lever is moved into the engaged position. This rotates both cams into the engaged position and pulls the card cage towards the mother board such that electrical contact is made and such that the card cage is mechanically secured within the chassis.

Cards may be removed by moving the locking lever into the disengaged position. This disengages the cams from the posts attached to the motherboard. The card cage then may be pulled out from the chassis. The card cage is then opened and the desired card is removed.

The present invention also mates conventional card edge connectors and pin-in-socket connectors. Conventional pin-in socket connectors and card edge connectors typically require a significant force to insert and extract the connectors, which must be applied over the insertion distance of the connector. Once fully inserted, no additional force is needed. Compression connectors, by contrast, typically have zero insertion force. However, force must be applied to the compression connector after insertion in order to maintain connectivity. The present invention allows for the insertion of the card cage into the chassis, applies sufficient force to mate any card edge connectors and pin-in-socket connectors, ensures that the compression connector is properly in contact with the motherboard and applies sufficient force to the compression connector to maintain connectivity.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1A is a front view illustrating a chassis of a computer which includes a card cage receiving opening which does not have a card cage installed in accordance with the present invention.

FIG. 1B is a front view illustrating a card cage installed into the card cage receiving opening of the chassis of a computer in accordance with the present invention.

FIG. 2 is a perspective view illustrating a card cage in accordance with the present invention.

FIG. 3 is a rear view of a card cage which has circuit board cards attached thereto in accordance with the present invention.

FIG. 4 is a cut-away right side view illustrating a card cage which is in the disengaged position and which does not have circuit board cards attached thereto in accordance with the present invention.

FIG. 5 is left side cut-away view of a card cage which has a circuit board card installed therein and which is in the disengaged position in accordance with the present invention.

FIG. 6 is left side cut-away view of a card cage which has a circuit board card installed therein and which is in the engaged position in accordance with the present invention.

FIG. 7 is a detailed cut-away top view of a card cage in the disengaged position which is inserted into a computer in accordance with the present invention.

FIG. 8 is a detailed cut-away side view of a card cage which is in the engaged position and which is inserted into a computer in accordance with the present invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

With reference now to FIG. 1A, chassis 1 includes card cage receiving opening 3 which exposes portions of motherboard 4. Attached to motherboard 4 is backplate hook 9 which includes posts 6–7 and an opening which exposes grid array 8 of motherboard 4. Connector receptacles are also attached to motherboard 4. Card cage 2 shown in FIG. 1B fits within card cage receiving opening 3 shown in FIG. 1A and is securely held in place by the operation of locking lever 10. Card cage 2 includes a front side surface within which openings 15 are formed. Openings 15 allow for input and output connectors to protrude from the front side surface for connection of external cables.

FIG. 2 shows card cage 2 to include provision for connection to computer 100 shown in FIGS. 1A–1B which is shown as connection mechanism 200. In the embodiment shown in FIG. 2, connection mechanism 200 includes card edge connectors 17–18 located on daughter board 23, compression connector 24, and flex cable 25. Compression connector 24 and flex cable 25 are attached to daughter board 23. Card cage 2 includes housing 20 which includes housing bottom 21 and housing top 22 which fits over housing bottom 21. In one embodiment, housing bottom is formed by bending a metal sheet into a u-shape and housing top 22 is formed by bending a second metal sheet into a u-shape such that housing top 22 fits snugly over housing bottom 21.

Daughter board 27 of FIG. 2 is also disposed within card cage 2. Daughter board 27 is electrically connected to daughter board 23 by flex cable 26. Both daughter board 27 and daughter board 23 are secured to bottom housing 21. Connection mechanism 200 also includes a mechanism for engaging and disengaging compression connector 24, shown generally as locking mechanism 300. Locking mechanism 300 includes cam 28. Cam 28 includes a hook-shaped region shown as hook 29 which extends from one end of cam 28.

FIG. 3 shows a rear view of card cage 2 with circuit board cards attached to daughter board 27. In the embodiment shown in FIG. 3, circuit board cards conforming to the PCI standard such as PCI cards 30–32 are attached to daughter board 27 via connector receptacles 33–35 which mate with card edge connectors located on PCI cards 30–32. Electrical contact between PCI cards 30–32 and computer 100 of FIGS. 1A–1B is made through flex cable 26, daughter board 27, and flex cable 25. Flex cable 26 electrically connects connector receptacles 33–35 to daughter board 27. Daughter board 27 is electrically connected to flex cable 25. Electronic circuits for processing signals transmitted to and from PCI cards 30–32 are disposed on daughter board 27. Alternatively, electrical connection may be also made to electrical circuits located on daughter board 27.

Continuing with FIG. 3, locking mechanism 300 includes cam 38 which is shown to extend from one side of compression connector 24 such that daughter board 27 lies between compression connector 24 and cam 38. Locking mechanism 300 includes locking lever 10 and arm 40 (not shown). Arm 40 couples locking lever 10 with cam 38 such that the movement of locking lever 10 rotates cam 38. Cam 38 is connected with cam 28 via a pin which connects to both cam 38 and cam 28 and which is disposed within compression connector 24 such that it may freely rotate. Thus, cam 28 rotates with the rotation of cam 38.

FIG. 4 shows locking lever 10 in the disengaged position. Arm 40 is shown to be disposed within housing 20 such that arm 40 moves with the rotation of locking lever 10. Movement of arm 40 and locking lever 10 is constrained by the movement of screw 39 within slot 42 such that movement is allowed only within a limited range necessary to rotate cams 28, 38 so as to move the mechanism for engaging and disengaging compression connector 24 between an engaged position and an disengaged position such that card cage 2 of FIG. 1B, and FIGS. 2–4 may be coupled and uncoupled from computer 100 of FIGS. 1A–1B.

FIG. 5 shows card cage 2 when locking lever 10 is in the disengaged position. In the disengaged position, screw 39 is at one end of slot 42 such that locking lever 10 extends out from the front of card cage 2. Arm 40 is pivotally connected to locking lever 10 by screw 57 and is pivotally connected to cam 38 by screw 58. Cam 38 includes extended region 58 which extends from the main body of cam 38 so as to provide leverage for the rotation of cam 38. Cam 38 also includes a hook-shaped region shown as hook 52 which extends from one end of cam 38. Screw 39 prevents further movement of locking lever 10 by engaging the end of slot 42.

Upon the rotation of locking lever 10 into the engaged position, locking lever 10 pivots about screw 37 and extends arm 40 so as to rotate cam 38 into the position shown in FIG. 6. The rotation of cam 38 rotates cam 28, shown in FIG. 7.

In operation, when card cage 2 is placed into a card cage receiving opening in a computer such as card cage receiving opening 3 of computer 100 shown in FIG. 1A, hook 52 of FIG. 5 is proximate to post 7 of FIG. 1A and hook 29 of FIG. 2 is proximate to post 6 of FIG. 1A. FIG. 7 shows a cut-away detailed view which illustrates the position of connection mechansim 200 when locking mechanism 300 is in the disengaged position and when card cage 2 is inserted into card cage receiving opening 3 of FIG. 1A.

Movement of locking lever 10 into the engaged position when card cage 2 is in card cage receiving opening 3 of FIG. 1A rotates cam 28 and cam 38 such that hook 52 of FIG. 5 engages post 7 of FIG. 1A and hook 29 of FIG. 2 engages post 6 of FIG. 1A so as to pull compression connector 24 of FIG. 5 against flex cable 25 such that flex cable 25 makes electrical contact with grid array 8 of FIG. 1A and such that card edge connectors 17–18 of FIG. 2 mate with connector receptacles 5 and 11 of FIG. 1. Movement of lever 10 into the engaged position when card cage 2 is in card cage receiving opening 2 of FIG. 1A, locks card cage 2 securely within card cage receiving opening 3 since card cage 2 is securely held by the engagement of hooks 29 and 52 with posts 6–7 of FIG. 1A. This results in a card cage which is locked into chassis 11 as shown in FIG. 1B.

FIG. 8 shows a detailed cut-away side view of card cage 2 inserted into card cage receiving opening 2 of FIG. 1A and when locking mechanism 300 is in the engaged position such that connection mechanism 200 is engaged with motherboard 4 so as to electrically and mechanically connect card cage 2 to motherboard 4. It can be seen that grid array 8 is in contact with the corresponding grid array of flex circuit 25 so as to electrically couple motherboard 4 to flex circuit 25. Hook 52 is shown to engage post 7 so as to mechanically attach card cage 2 to motherboard 1.

Card cage 2 of FIG. 1B is easily removed from chassis 11 by the operation of lever 10 such that lever 10 is moved into the disengaged position. This rotates hook 29 of FIG. 2 and hook 52 of FIG. 5 such that they no longer engage posts 6–7 of FIG. 1A. This frees card cage 2 of FIG. 1B such that it may be easily removed from chassis 11. Access to PCI cards 30–32 of FIG. 3 and connector receptacles 33–35 is easily obtained by removal of housing top 22 from bottom housing 21. In the event screws are used to secure housing top 22, the screws simply need to be removed to open housing top 22. Then, circuit board cards such as PCI cards 30–32 of FIG. 3 may be easily added and removed as desired.

After the required installation or card removal is performed, housing top 22 of FIG. 2 is placed on top of housing bottom 21 and is attached by insertion of screws. Then, card cage 2 of FIG. 1B is inserted into card cage receiving opening 3 of FIG. 1A. Card cage 2 is then securely locked in place and electrical connection is obtained by the movement of lever 10 into the engaged position.

Connection between card cage 2 and computer 100 in FIGS. 1–8 is shown to incorporate the use of a compression connector so as to minimize signal delay and crosstalk. Connection also is provided by card edge connectors. However, the card cage of the present invention is well adapted for connection using any of a number of other known connection mechanisms. In an alternate embodiment, (not shown) connection is via card edge connectors exclusively. Alternatively, any of a number of other connection mechanisms could be used such as, for example, one or more RS232 connectors, serial ports, or parallel ports, etc. In addition, any of a number of other methods for physically securing card cage 2 to chassis 11 could also be employed such as, for example, rotating locking mechanisms, snaps, or hooks.

Though card cage 2 is shown to include multiple daughter boards, alternatively, a single daughter board could be used. In addition, connector receptacles could be directly connected to the connection mechanism (card edge connectors 17–18 and flex cable 25). Moreover, a fan could be installed into the card cage of the present invention so as to facilitate cooling of the electronic circuits contained within the card cage and any installed PCI cards.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A card cage for coupling circuit board cards to a computer having an opening adapted to receive a card cage, the card cage comprising:

a housing;

a circuit board disposed within said housing;

a connector receptacle connected to said circuit board for receiving a circuit board card; and a connection mechanism electrically coupled to said connector receptacle, said connection mechanism including a compression connector and a flex circuit, said compression connector engaging said flex circuit for electrically coupling said connector receptacle with said computer and a cam for mechanically coupling said card cage to said computer, said connection mechanism including a lever coupled to said cam such that operation of said lever moves said cam for engaging and disengaging said card cage from said computer.

2. The card cage of claim 1 wherein said connection mechanism further comprises a card edge connector, said card edge connector electrically coupled to said connector receptacle.

3. The card cage of claim 1 wherein said connector receptacle is adapted to receive a circuit board card conforming to the peripheral component interconnect (PCI) standard, revision 2.1.

4. The card cage of claim 1 further comprising a second circuit board, said connection mechanism attached to said second circuit board.

5. The card cage of claim 4 wherein said second circuit board includes electrical circuits and wherein said electrical circuits of said second circuit board are electrically connected to said connector receptacle.

6. A computer system comprising:

a chassis;

a motherboard having electronic circuits disposed thereon and a connective region, said motherboard disposed within said chassis;

a card cage including a connection mechanism and a plurality of connector receptacles adapted to receive circuit board cards, said connection mechanism including a compression connector and including a flex circuit electrically coupled to said connector receptacles, said connection mechanism also including a cam and a lever coupled to said cam such that, upon the insertion of said card cage into said computer chassis, operation of said lever rotates said cam such that said compression connector forces said flex circuit against said connective region to electrically couple said connector receptacles to said motherboard.

7. The computer system of claim 6 wherein said connection mechanism further includes an arm that is coupled to said cam and that is coupled to said lever.

8. A method for coupling a circuit card to a computer comprising:

providing a card cage that includes a housing and a plurality of connector receptacles, each of said plurality of connector receptacles adapted to receive circuit board cards, said card cage including a connection mechanism that includes a compression connector and a flex circuit that is electrically coupled to said plurality of connector receptacles, said connection mechanism also including a lever that is coupled to a cam, said lever coupled to said cam such that movement of said lever operates to rotate said cam;

inserting a circuit card into one of said plurality of connector receptacles;

inserting said card cage into said computer; and operating said lever so as to rotate said cam, the rotation of said cam mechanically coupling said card cage to said computer and moving said compression connector such that said compression connector engages said flex circuit to electrically couple said plurality of connector receptacles to said computer.

9. The method of claim 8 further comprising the step of:

disengaging said card cage from said computer by operating said lever so as to rotate said cam such that said cam is disengaged from said computer.

* * * * *